United States Patent [19]

Nakanishi et al.

[11] Patent Number: 4,644,385

[45] Date of Patent: Feb. 17, 1987

[54] COOLING MODULE FOR INTEGRATED CIRCUIT CHIPS

[75] Inventors: Keiichirou Nakanishi, Kokubunji; Minoru Yamada, Iruma; Akira Masaki, Meguro; Kuninori Imai, Shiroyama; Katuaki Chiba, Kokubunji, all of Japan

[73] Assignee: Hitachi, Ltd., Tokyo, Japan

[21] Appl. No.: 665,548

[22] Filed: Oct. 26, 1984

[30] Foreign Application Priority Data

Oct. 28, 1983 [JP] Japan ................................ 58-200945

[51] Int. Cl.[4] ............................................. H01L 25/04
[52] U.S. Cl. ...................................... 357/82; 165/80.4; 361/385
[58] Field of Search ...................... 165/80 C, 83, 80.4; 174/15 R; 357/82; 361/385, 388, 386

[56] References Cited

U.S. PATENT DOCUMENTS

| 3,481,393 | 12/1969 | Chu | 361/385 |
| 4,109,707 | 8/1978 | Wilson et al. | 357/82 |
| 4,138,692 | 2/1979 | Meeker et al. | 357/82 |
| 4,254,431 | 3/1981 | Babuka et al. | 357/82 |
| 4,558,395 | 12/1985 | Yamada et al. | 361/385 |
| 4,561,040 | 12/1985 | Eastman et al. | 361/385 |

OTHER PUBLICATIONS

*IBM Technical Disclosure Bulletin,* vol. 20, No. 10, Mar. 1978, Pascuzzo et al., "Integrated Circuit Module Package Cooling Structure", pp. 3898-3899.
*IBM Technical Disclosure Bulletin,* vol. 20, No. 9, Feb. 1978, Anacker, "Liquid Cooling of Integrated Circuit Chips", pp. 3742-3743.
*IBM Technical Disclosure Bulletin,* vol. 19, No. 4, Sep. 1976, Jeannotte, "Circuit Module with Gallium Metal Cooling Structure", p. 1348.
*IBM Technical Disclosure Bulletin,* vol. 23, No. 2, Jul. 1980, Amendola, "Cooling Structure for an Integrated Circuit Module", p. 602.
*Electronics,* vol. 55, No. 17, Aug. 25, 1982, Fields, "Grooved Substrate Boosts IC Cooling", pp. 46-47.

*Primary Examiner*—John Lee
*Attorney, Agent, or Firm*—Antonelli, Terry & Wands

[57] ABSTRACT

This invention concerns a cooling module for integrated circuit chips, characterized in that it is provided with cooling members through which a coolant circulates, and which are connected directly, or via insulating plates, to a plurality of integrated circuit chips mounted on a wiring substrate, and pipes which introduce the coolant into the cooling members and which have a resiliency which is high enough to enable the pipes to expand and contract in the direction perpendicular to the wiring substrate.

19 Claims, 6 Drawing Figures

4,644,385

COOLING MODULE FOR INTEGRATED CIRCUIT CHIPS

BACKGROUND OF THE INVENTION

This invention relates to a cooling module for integrated circuit chips and, more particularly, to a cooling module for integrated circuit chips which can effectively remove heat from a plurality of high-power integrated circuit chips mounted on a substrate, and which enables the easy replacement of the integrated circuit chips.

An apparatus disclosed in U.S. Pat. No. 4,245,273 is an example of a cooling structure for a multi-chip module in which a plurality of integrated circuit chips are mounted on a single wiring substrate. This structure has two gaps (between the integrated circuit chips and a piston and between the piston and a housing) in a thermal conduction path which extends between the integrated circuit chips and a coolant, and it is necessary to rely upon a gas which has an extremely low thermal conductivity to transmit heat across these gaps. Since the facing surfaces of the piston and housing must have large areas, the length of the piston cannot be reduced, and so the length of the thermal conduction path is increased. Therefore, the extent to which the thermal resistance between the chips and coolant can be reduced is limited.

SUMMARY OF THE INVENTON

Some of the inventors of the present invention, together with another person who is not included amongst the inventors of the present invention, proposed (in U.S. Pat. No. 4,558,395, issued Dec. 10, 1985) a cooling module for integrated circuit chips, which is designed to effectively cool a plurality of high-power integrated circuit chips, and which is provided with coolng members for each integrated circuit chip, which are each provided with a hollow space through which a suitable coolant fluid can be circulated, and flexible pipes connected to the cooling members through which the coolant is introduced into and withdrawn from the cooling members. In order to replace a defective chip in this structure, it is necessary to remove a bellows (used to connect the cooling members together), or remove a cooling member from the chip by locally heating it, and then displacing it to expose the rear surface of the chip.

An object of the present invention is to provide a cooling module for integrated circuit chips which is capable of effeciently cooling a plurality of high-power integrated circuit chips which are provided in the cooling module disclosed in the prior application, and which enables the easy renewal of a defective integrated circuit chip, without effecting the advantage of the present invention in that any differences between the heights of the chips does not alter the cooling efficiency.

In order to achieve this object, the present invention provides a cooling module for integrated circuit chips which comprises cooling members through which a coolant is circulated and which are placed on integrated circuit chips mounted on a wiring substrate, and pipes which are connected to the cooling members and which can expand and contract in the direction perpendicular to the wiring substrate, and a coolant is introduced into and withdrawn from the cooling members through the pipes.

DESCRIPTION OF THE PREFERRED EMBODIMENTS

Figure 1:
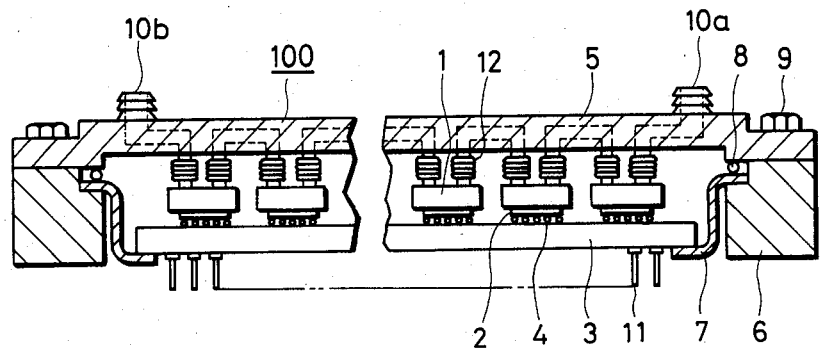
FIG. 1 is a section through an embodiment of the present invention.

FIG. 1 is a section through part of an embodiment of the present invention.

A cooling module 100 for integrated circuit chips seals in a plurality of integrated circuit chips 2, and is provided with a means for cooling the chips. The sealing in of the chips 2 is done by fastening a flange 7 to both a wiring substrate 3 and a housing 6, and then a cap 5 to the housing 6 over an O-ring 8 by screws 9. A plurality of integrated circuit chips 2 are mounted on the upper surface of the substrate 3 on solder terminals 4, and a plurality of module pins 11 for connecting the cooling module 100 to a circuit card or a circuit board are provided on the lower surface of the substrate. A circuit formed on a chip 2 is connected to those formed on other chips and to the module pins 11 by the solder terminals 4 and wiring formed on and in the substrate 3. The heat generated in each integrated circuit chip 2 is conducted to the cooling member 1 attached to the upper surface thereof, so that the chip is cooled by a coolant circulated in the cooling member. The coolant flows into the cooling module from the outside thereof through a nozzle 10a, is circulated through the rows of cooling members 1 through flexible pipes (bellows) 12, and flows out of the cooling module through a nozzle 10b.

Figure 2:
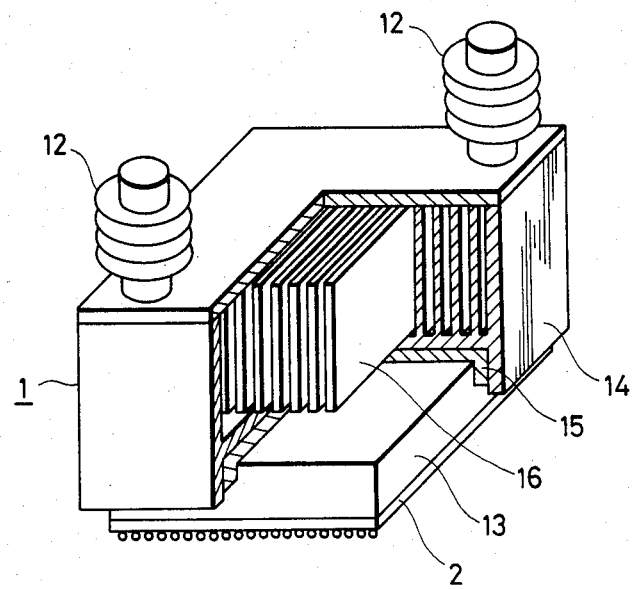
FIG. 2 is a partially-cutaway perspective view of a cooling member.

FIG. 2 is an enlarged view of a cooling member. The cooling member 1 consists of a cooling block 14 with internal fins 16 between which a coolant flows, so that heat is connected from the fins to the coolant. The cooling block is made by forming a lower wall and the fins integrally of a material of a high thermal conductivity, such as copper, and fixing the resultant block to the inner surface of a separately-formed cover by brazing. The bellows 12, which can expand and contract in the direction perpendicular to the surface of the wiring substrate 3 (shown in FIG. 1), are connected to the upper surface of the cooling block 14. The bellows 12 must be flexible, and perferably consist of, for example, copper or nickel. In this embodiment, the bellows are provided so as to extend in the direction perpendicular to the wiring substrate, so that the pressure of the coolant flowing through the bellows acts to press the cooling block 14 against the integrated circuit chip 2. Therefore increasing the pressure of the coolant increases the cooling efficiency. Since the bellows in this embodiment extend perpendicularly, the area occupied thereby on the wiring substrate is small, so that a large number of integrated circuit chips can be mounted on the wiring substrate.

The bellows 12 are connected to a coolant channel provided in the cap 5 above the cooling blocks. Methods of fixing the bellows which can be used in the present invention include brazing and soldering. An insulator 13, which is made of a material with a high electrical insulating strength, a high thermal conductivity, and a thermal expansion coeffiient substantially equal to that of the integrated circuit chips 2 (for example, silicon carbide which has a high thermal conductivity and a large insulating strength can be used effectively for silicon integrated circuit chips) is fixed to the lower surface of the cooling block which has projections at peripheral edges thereof, by a bonding layer 15 which consists of a metal with a low melting point, such as solder, the lower surface of the cooling block, except for that of the projections being in contact with the upper surface of the insulator. The lower surface of the insulator 13 is attached to the rear surface of the integrated circuit chip.

In an experimental example provided with a copper cooling block 14; a 1.5 mm thick insulator 13 of silicon carbide, which has a high thermal conductivity and a high electrical insulating strength; $10 \times 10$ mm$^2$ integrated circuit chips 2; fins 16 arranged at regular intervals of 200 $\mu$m, each being 200 $\mu$m thick and 2.1 mm high; a 100 $\mu$m thick bonding layer of solder; and water (flow rate of 10 cm$^3$/sec) acting as coolant; it was found that the thermal resistance between the chip and coolant could be reduced to at most 0.5° C./W, and that the permissible power dissipation of the chip was about 100 W.

Any tilting of the integrated circuit chips 2 and differences in height thereof due to deflection of the substrate and differences in height of the solder terminals 4, can be absorbed by the bellows by expanding and contracting without adversely affecting the thermal resistance.

Figure 3:
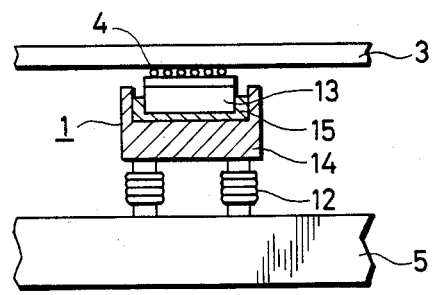
FIG. 3 is a section through the bonding layer when the cooling module is in normal use.
Figure 4:
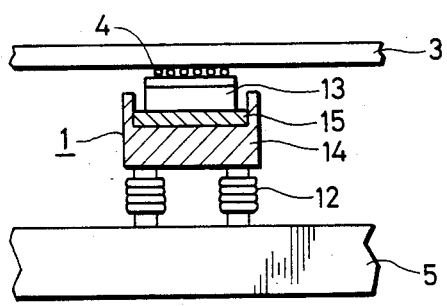
FIG. 4 is a section through the bonding layer during chip-mounting or removal operations.

FIGS. 3 and 4 illustrate the procedure for replacing a defective chip. FIG. 3 illustrates a cooling member 1 when inverted, its orientation in normal use. In order to replace a chip, the screws 9 are removed with the device placed as shown in FIG. 3, and the whole cooling module is heated. If the metal of the bonding layer 15 is selected to have the lowest melting point among the melting points of the brazing materials or soldering materials with which the various parts of the cooling module are joined together, the substrate 3 and housing 6 can be separated from the cap 5 between the insulator 13 and cooling block 14 without damaging the other joints of the cooling module. An integrated circuit chip and its insulator, which are on the side of the substrate, can then be removed by locally heating them, and the old chip can be replaced with a new one.

FIG. 4 shows the condition of the bonding layer 15 after the chip has been replaced, but before the chip has been attached. When the screws 9 are tightened, a force is applied to the bellows in the compression direction thereof. However, if the whole cooling module is heated again, the metal of the bonding layer 15 melts again and the bellows are released from the force applied thereto, so that the cooling module returned to the condition shown in FIG. 3, with the insulator and cooling block fixed to each other again.

During this time, tilting of the integrated circuit chip and differences in the height thereof can occur, which cannot be avoided even if the cooling module is designed to prevent this, and which are ascribed to deflection of the substrate 3 and differences in height of the solder terminals 4. However, all of these undesirable phonomena are absorbed by the bonding layers 15 and bellows 12 and have no bad effect upon the thermal resistance. The projection at peripheral edges of the lower wall of each cooling block 14 act as chip-positioning guides, and prevent the low melting point metal which rises around the insulator 13 from overflowing outside while the condition of the cooling module change from that shown in FIG. 4 to that shown in FIG. 3.

As described above, even if a chip is tilted or there is a difference in height between chips, the thermal resistance does not increase because of the thick bonding layers 15 and the expansion and contraction of the bellows 12, and, moreover, the replacement of a chip can be effected easily.

Figure 5:
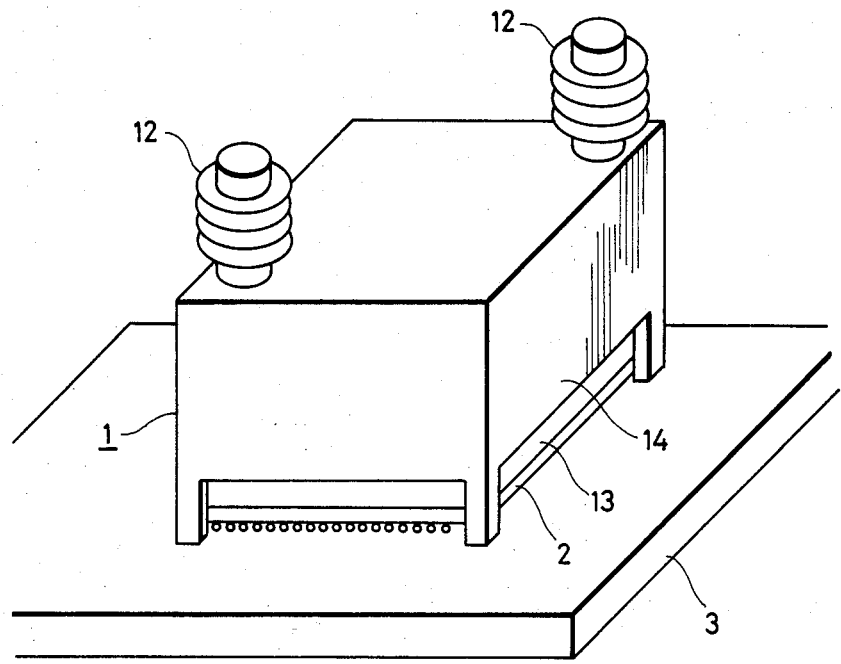
FIG. 5 is a perspective view of another embodiment.
Figure 6:
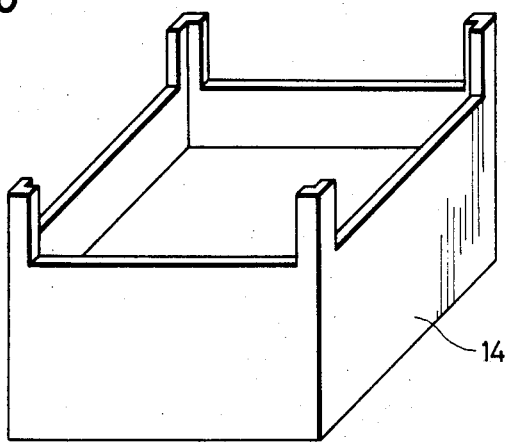
FIG. 6 is a perspective view of the bottom surface of a cooling block of the embodiment of FIG. 5.

FIG. 5 is a perspective view of a principal portion of another embodiment of the present invention. In this embodiment, the projections of the cooling block 14 are made deeper than that shown in FIG. 2, so that lower ends of projections at peripheral sides thereof come into contact with the substrate 3. When the bellows 12 is too hard during the mounting of an integrated circuit chip as shown in FIG. 3, unnecessarily large forces generated in the chip 13 can be eliminated by this construction. In this construction, the projections on peripheral sides of the lower surface of the cooling block may be partially removed, as shown in FIG. 6, to expose the side surfaces of the chip. Consequently, when a pad (not shown) used for repairing the wiring on or in the substrate is provided on a portion of the surface of the substrate around the chip, the repair apparatus can be handled easily.

In the embodiments described above, an insulator 13 is provided between a cooling block 14 and an integrated circuit chip 2. When the rear surface of the chip is at ground potential, or when the cooling block consists of a material which has a high thermal conductivity and a high electrical insulating strength (for example, above-mentioned silicon carbide), the insulator can be omitted.

Each integrated circuit chip 2 and the substrate 3 are connected by controlled-collapse bonding (C. C. B.) using solder terminals 4, but they can be connected by any method, provided that the chip can be mounted on the substrate with the rear surface of the former exposed thereon, for example, by face down tape automated bonding (face down T.A.B.).

According to the present invention as described above, the thermal conduction path between a chip and a coolant is short, and a material of a high thermal conductivity is used, so that a low thermal resistance of less than 0.5° C./W can be obtained. Since flexible pipes whose resiliency acts in the direction perpendicular to the wiring substrate are used, the thermal resistance is not adversely affected by differences in the heights of the chips and tilting thereof, caused by deflection of the substrate and differences in the heights of the solder terminals, and a chip can be replaced very easily.

What is claimed is:

1. A cooling module for integrated circuit chips, comprising a plurality of integrated circuit chips mounted on a wiring substrate, a plurality of cooling members which are placed on each of said integrated circuit chips and which are provided with internal spaces through which a coolant circulates, first pipe means connected to each of said cooling members so as to introduce said coolant thereinto, second pipe means connected to each of said cooling members so as to withdraw coolant therefrom, wherein said first and second pipe means have resilient bellows expandable in a direction perpendicular to a surface of said wiring substrate so that said pipe means can expand and contract in the direction perpendicular to the surface of said wiring substrate, and a coolant channel connected to said first and second pipe means so as to introduce and withdraw said coolant thereinto and therefrom 2. The cooling module according to claim 1, wherein each of said cooling members consists of a cooling block with said spaces therein, and fins provided in said spaces so as to be in thermal contact with said cooling block.

3. The cooling module according to claim 2, wherein said cooling block is made of a material which has an electrical insulating property and a high thermal conductivity.

4. The cooling module according to claim 3, wherein said cooling block is made of silicon carbide.

5. The cooling module according to claim 2, wherein a surface of said cooling block which faces the corresponding integrated circuit chip is provided with projections which extend so as to surround said circuit chip.

6. The cooling module according to claim 5, wherein free end portions of said projections provided on said cooling block are placed in contact with the surface of said wiring substrate so as to reduce the pressure applied to said integrated circuit chip.

7. The cooling module according to claim 5, wherein said projections provided on said cooling block surround only part of a side surface of said integrated circuit chip.

8. The cooling module according to claim 1, wherein said cooling module also includes a flat plate which is provided between said cooling members and said integrated circuit chips, and which is made of a material which has an electrical insulating property and a high thermal conductivity.

9. The cooling module according to claim 8, wherein each said cooling member is mounted on said flat plate and is made of a material which has electrical conductivity and a high thermal conductivity.

10. The cooling module according to claim 9, wherein said cooling member is made of copper.

11. The cooling module according to claim 10, wherein the surface of said cooling member which faces said integrated circuit chip is provided with projections surrounding said circuit chip.

12. The cooling module according to claim 11, wherein free end portions of said projections provided on said cooling member are placed in contact with the surface of said wiring substrate so as to reduce the pressure applied to said integrated circuit chip.

13. The cooling module according to claim 11, wherein said projections provided on said cooling member surround only part of a side surface of said integrated circuit chip.

14. The cooling module according to claim 8, wherein each said cooling member is placed on said flat plate and is made of a material which has an electrical insulating property and a high thermal conductivity.

15. The cooling module according to claim 14, wherein said cooling member is made of silicon carbide.

16. The cooling module according to claim 8, wherein said flat plate is made of silicon carbide.

17. The cooling module according to claim 1, wherein the cooling members have fins formed integrally at a lower wall thereof.

18. A multi-chip module comprising a wiring substrate, a plurality of integrated circuit chips mounted on said wiring substrate, a plurality of cooling members which are placed on each of said integrated circuit chips and which are provided with internal spaces through which a coolant circulates, first pipe means connected to each of said cooling members so as to introduce said coolant thereinto, second pipe means connected to each of said cooling members so as to withdraw said coolant therefrom, said first and second pipe means having resilient bellows expandable in a direction perpendicular to a surface of said wiring substrate so that said pipe means can expand and contract in the direction perpendicular to said wiring substrate, and a casing which has a cap opposite said wiring substrate which is provided with a hollow space acting as a channel for the introduction of said coolant into said first and second pipe means and side walls, and which seals in said integrated circuit chips.

19. The multi-chip module according to claim 18, wherein said multi-chip module also includes flat plates which are each provided between one of said cooling members and one of said integrated circuit chips, and which are each made of a material which has an electrical insulating property and a high thermal conductivity.

* * * * *